United States Patent
Lee et al.

(10) Patent No.: US 9,431,592 B2
(45) Date of Patent: Aug. 30, 2016

(54) SUBMOUNT WITH CAVITIES AND THROUGH VIAS FOR LED PACKAGING

(75) Inventors: Shi-Wei Lee, Hong Kong (CN); Rong Zhang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 77 days.

(21) Appl. No.: 14/122,929

(22) PCT Filed: Jun. 1, 2012

(86) PCT No.: PCT/CN2012/000752
§ 371 (c)(1),
(2), (4) Date: Jan. 7, 2014

(87) PCT Pub. No.: WO2012/163086
PCT Pub. Date: Dec. 6, 2012

(65) Prior Publication Data
US 2014/0110728 A1    Apr. 24, 2014

Related U.S. Application Data

(60) Provisional application No. 61/457,774, filed on Jun. 1, 2011.

(51) Int. Cl.
*H01L 21/00* (2006.01)
*H01L 33/62* (2010.01)
(Continued)

(52) U.S. Cl.
CPC ............... *H01L 33/62* (2013.01); *H01L 24/16* (2013.01); *H01L 25/075* (2013.01);
(Continued)

(58) Field of Classification Search
CPC ..... H01L 24/16; H01L 33/62; H01L 33/502; H01L 25/075; H01L 2924/12041; H01L 2933/0033
USPC ........................................ 257/88, 98; 438/27
See application file for complete search history.

(56) References Cited

U.S. PATENT DOCUMENTS 7,683,470 B2    3/2010  Lee et al.
7,745,832 B2 *  6/2010  Hsieh ................... H01L 33/641
                                                  257/706

(Continued)

FOREIGN PATENT DOCUMENTS

CN    201804913 U    4/2011

OTHER PUBLICATIONS

Tsou et al., "Silicon-based packaging platform for light-emitting diode," *IEEE Transactions on Advanced Packaging*, vol. 29(3), pp. 607-614, 2006.

(Continued)

*Primary Examiner* — Victor A Mandala
*Assistant Examiner* — Colleen E Snow
(74) *Attorney, Agent, or Firm* — Leydig, Voit & Mayer, Ltd.

(57) ABSTRACT

A wafer having a plurality of light-emitting diode (LED) submounts and a method for fabricating an LED submount are provided. Each of the plurality of LED submounts of the wafer includes: a substrate (201), including through vias (203a); an LED die (208) mounted in a cavity (204) on a first side of the substrate (201) and connected to the through vias (203a); a redistribution layer (205a) attached to a second side of the substrate (201) connected to the LED die (208) through the through vias (203a). The method includes providing a wafer as a substrate (201); providing a cavity (204) in the substrate (201) on a first side of the substrate (201); providing through vias (203a) in the substrate (201), providing a redistribution layer (205a) on the second side of the substrate (201), and mounting an LED (208) in the cavity (204), wherein the LED die (208) is connected to the redistribution layer (205a) through the through vias (203a).

7 Claims, 13 Drawing Sheets

(51) Int. Cl.
*H01L 23/00* (2006.01)
*H01L 25/075* (2006.01)
*H01L 33/50* (2010.01)

(52) U.S. Cl.
CPC ........ *H01L 33/502* (2013.01); *H01L 2224/16* (2013.01); *H01L 2224/16145* (2013.01); *H01L 2224/48091* (2013.01); *H01L 2224/48247* (2013.01); *H01L 2224/48465* (2013.01); *H01L 2924/01029* (2013.01); *H01L 2924/10253* (2013.01); *H01L 2924/12041* (2013.01); *H01L 2933/0033* (2013.01)

(56) References Cited

U.S. PATENT DOCUMENTS

| | | | |
|---|---|---|---|
| 8,093,711 B2* | 1/2012 | Zudock | H01L 21/568 257/698 |
| 2003/0071366 A1* | 4/2003 | Rubinsztajn | C08G 59/24 257/791 |
| 2005/0274959 A1 | 12/2005 | Kim et al. | |
| 2007/0189007 A1 | 8/2007 | Nishimoto et al. | |
| 2007/0215896 A1 | 9/2007 | Sun et al. | |
| 2007/0228387 A1 | 10/2007 | Negley et al. | |
| 2008/0179618 A1 | 7/2008 | Cheng | |
| 2009/0081867 A1 | 3/2009 | Taguchi et al. | |
| 2009/0121252 A1* | 5/2009 | Hsu | H01L 33/486 257/99 |
| 2010/0129960 A1* | 5/2010 | Mejima | H01L 24/11 438/107 |
| 2010/0252934 A1* | 10/2010 | Law | H01L 23/481 257/774 |
| 2013/0161824 A1* | 6/2013 | Choi | H01L 21/76898 257/774 |

OTHER PUBLICATIONS

Lim et al., "LED packaging using high sad rectangular microlens array," *Micro-Optics, VCSELs, and Photonic Interconnects II: Fabrication, Packaging, and Integration, Process of SPIE*, vol. 6185, pp. 6181516-1-7, 2006.

International Search Report and Written Opinion from the International Searching Authority in International Patent Publication No. PCT/CN2012/000752, Sep. 6, 2012.

* cited by examiner

US 9,431,592 B2

SUBMOUNT WITH CAVITIES AND THROUGH VIAS FOR LED PACKAGING

CROSS-REFERENCE TO RELATED APPLICATIONS

This application is a U.S. National Phase application under 35 U.S.C. §371 of International Application No. PCT/CN2012/000752, filed on Jun. 1, 2012, and claims the benefit of U.S. Provisional Patent Application No. 61/457,774, filed Jun. 1, 2011. The International Application was published in English on Dec. 6, 2012 as WO 2012/163086 A1 under PCT Article 21(2). The foregoing applications are incorporated by reference.

FIELD

The present invention relates to light emitting diodes and more specifically to a structure and method for packaging light emitting diodes.

BACKGROUND

LEDs (Light Emitting Diodes) are a promising replacement to traditional fluorescent and incandescent lighting due to superior characteristics such as low energy consumption, long operation life, compact size, fast response time, and mercury-free components. A popular white light LED configuration is the phosphor-converted LED (pc-LED), where blue LED chips are covered with yellow phosphor powders to convert the blue light into white light. This configuration has relatively low cost and has high conversion efficiency, compared to other typical white light LED technologies such as the RGB method and the ultraviolet LEDs with RGB phosphors method.

It is expected that a substantial portion of conventional incandescent and fluorescent lighting will be replaced by LEDs in the next 5-10 years. There are two major factors controlling the propagation of HB-LEDs (High Brightness LEDs) for SSL (Solid State Lighting) applications. One is optoelectronic efficacy and the other is the cost. Both factors are closely related to the packaging of LEDs. However, most conventional LED packaging methods require molds and peripheral components for either the phosphor coating or the lens forming, resulting in relative low throughput and high cost. In addition, thermal performance needs to be improved for high power LEDs. Therefore, a simplified yet more efficient packaging process is needed for LEDs so as to achieve low cost manufacture while delivering optimal optical and thermal performance.

FIG. 1 is an example of a sectional view of a conventional LED package 100. In this kind of package, an LED chip 113 is flip chip bonded by solder joints 115 to a flat silicon submount 117 including metal circuits (not shown) for electric connection between the LED chip 113 and the submount 117. The submount 117 with the LED chip 113 bonded together is then attached to a heat sink 101 by an adhesive 119. Further, the LED package 100 includes leads 107 which are held by a plastic body 105 and are wire bonded 103 to the silicon submount 117 to realize the electric connection. Then a lens (encapsulant) 111, which is fabricated in advance, covers the LED chip 113, wires 103 and the submount 117. The whole package is finally attached to the board 109 (e.g., a printed circuit board (PCB)) which performs electric signal distribution and heat dissipation.

The process of fabricating the LED package 100 shown in FIG. 1 suffers from high cost due to its complicated structure. Moreover, conventional LED dies are encapsulated individually, precluding the implementation of a mass production process that could potentially provide high yield with low cost.

SUMMARY

In an embodiment, the present invention provides a wafer having a plurality of light-emitting diode (LED) submounts. Each of the plurality of LED submounts of the wafer includes: a substrate, including through vias; an LED die mounted in a cavity on a first side of the substrate and connected to the through vias; and a redistribution layer attached to a second side of the substrate connected to the LED die through the through vias.

In another embodiment the present invention provides a method for fabricating a light-emitting diode (LED) submount. The method includes providing a wafer as a substrate; providing a cavity in the substrate on a first side of the substrate; providing through vias in the substrate, providing a redistribution layer on the second side of the substrate, and mounting an LED in the cavity, wherein the LED die is connected to the redistribution layer through the through vias. Providing the through vias includes providing blind vias in the substrate on a second side of the substrate; filling the blind vias with metal; and etching the substrate such that the metal in the blind vias is exposed in the cavity so as to produce the through vias. Providing the redistribution layer includes: providing a metal layer on the second side of the substrate; and patterning the metal layer so as to produce the redistribution layer.

BRIEF DESCRIPTION OF THE SEVERAL VIEWS OF THE DRAWING(S)

While the appended claims set forth the features of the present invention with particularity, the invention, together with its objects and advantages, may be best understood from the following detailed description taken in conjunction with the accompanying drawings of which:

Figure 4:
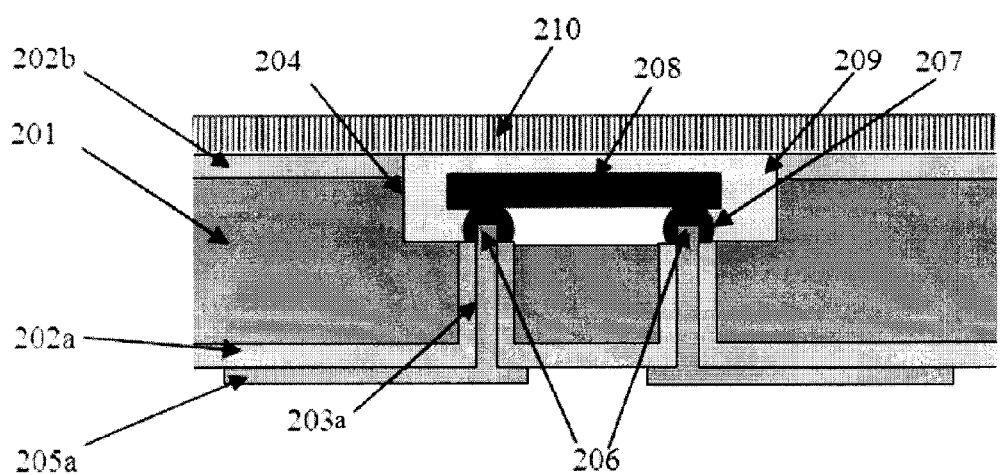
Figure 5:
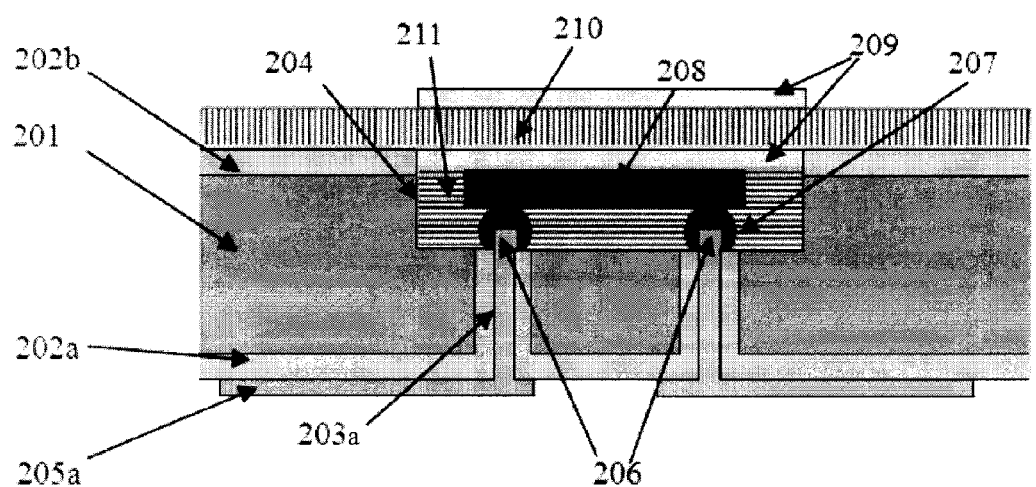
Figure 6:
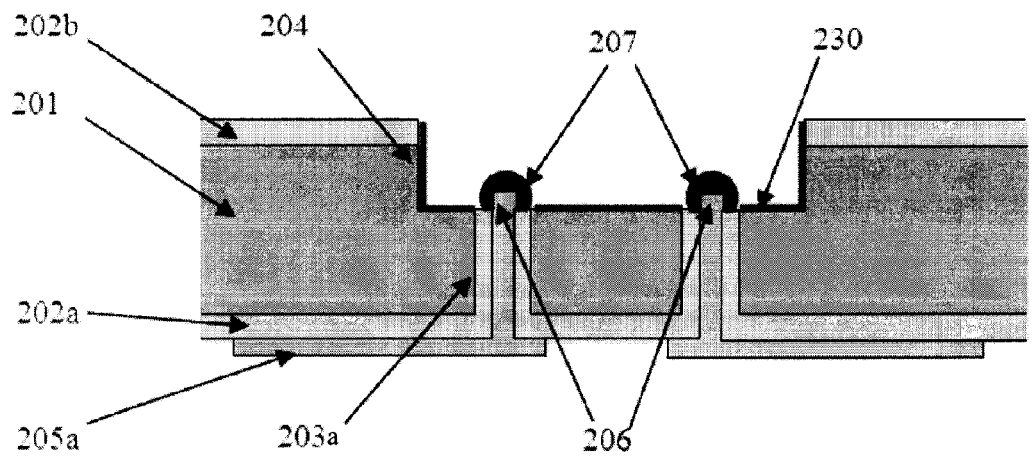

FIGS. 3(a) through 3(h) are diagrams illustrating an LED submount during different stages of the fabrication process in accordance with the described principles;

FIG. 4 is a diagram illustrating an LED submount having a transparent or translucent plate in accordance with the described principles;

FIG. 5 is a diagram illustrating an LED submount having a transparent or translucent plate and a layer of encapsulant mixed with phosphor powder in accordance with the described principles; and FIG. 6 is a diagram illustrating a reflective layer provided within the cavity of an LED submount in accordance with the described principles.

DETAILED DESCRIPTION

Embodiments of the present invention contemplate a structure and fabrication process of a substrate with cavities and through vias for LED packaging. In an embodiment, the process starts with the fabrication of blind holes on the backside and cavities on the front-side of the substrate. The substrate can be silicon, PCB, MCPCB, BT, glass, ceramic, plastic, metal, or made of other materials. It will be appreciated that, in the context of the present specification, "blind hole" (or "blind via") refers to a small hole that does not go through the entire substrate. The blind holes fabricated on the backside of substrate are filled with metal, such as copper, through an electroplating process that also covers the backside of the submount with metal. Then, the cavities on the front-side are further etched down to expose the metal, forming "through vias" (also referred to as "through silicon vias" (TSVs)) that connect the top side of the submount to the bottom side of the submount. It will further be appreciated that the cavities are where LED dies are mounted (as described in further below with respect to FIG. 3(g)). Later, the metal layer on the backside of the submount is patterned with a desired circuit.

The through vias structure generated by this process enables three-dimensional (3D) interconnection from the front-side to the backside of the substrate, which allows for electric interconnections not only on the surface of the submount (i.e., "horizontally"), but also to the bottom side of the submount through the "through vias" (i.e., "vertically"). The use of cavities allow for printing or injecting processes to fill the cavity with encapsulant, such that it is unnecessary to use a mold to coat the LED dies. Encapsulant with phosphor powders protects the LED dies and converts blue light into white light. It will be appreciated that this process overcomes a problem associated with conventional LED packaging where circuits could not be patterned on the bottom of the cavities of the front-side of the substrate.

Figure 1:
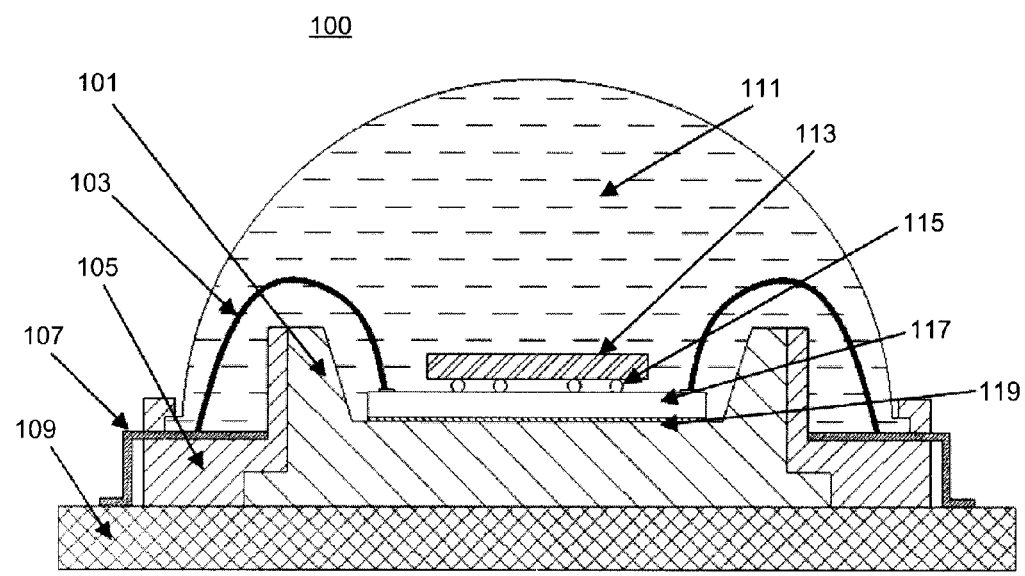
FIG. 1 is a diagram of an example of a conventional LED package.
Figure 2:
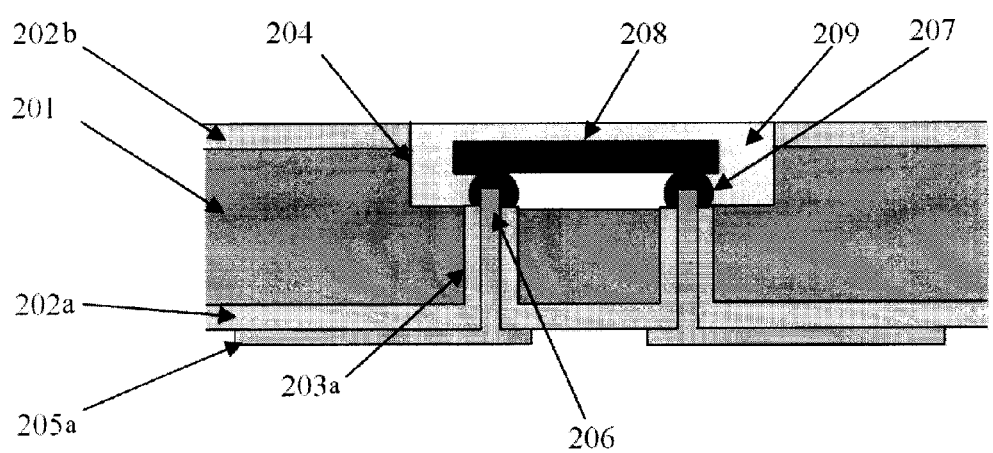
FIG. 2 is a diagram illustrating the components of an LED submount in accordance with the described principles.

Embodiments of the present invention will be explained in greater detail with respect to FIGS. 2-6. Turning now to FIG. 2, a schematic diagram is depicted showing a cross-section of a submount 200 according to the LED packaging structure of an embodiment. The packaging structure includes a core substrate 201, insulation layers 202a and 202b, through vias 203a on the backside of the substrate, a cavity 204 on the front-side of the substrate, a redistribution layer 205a on the backside of the substrate, metal pillars 206 connecting the bottom of the cavities 204 to the backside of the substrate, solder bumps 207, LED die 208, and encapsulant 209, which is a mixture of phosphor powder and encapsulant.

It will be appreciated that the submounts depicted in FIGS. 2 through 6 may be part of a wafer including a large number of such submounts—e.g., tens of thousands of such units. The processes described below with respect to FIGS. 3(a) through 3(h) and FIGS. 4 through 6 may be performed simultaneously on the wafer for a plurality of LED packages. After the processes described below have been completed, the wafer can then be separated into individual packages.

Figure 3A:
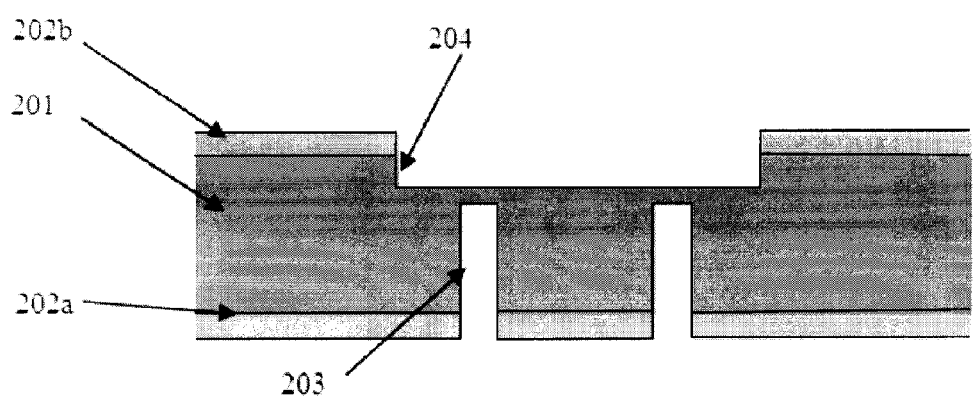

Turning to FIGS. 3(a) through 3(h), a cross-section of an LED packaging structure is shown at various stages throughout a process of fabricating the LED packaging structure according to an embodiment of the present invention. First, as shown in FIG. 3(a), insulation layers 202a and 202b are attached to a core substrate 201 by deposition, diffusion or printing. The blind vias 203 and cavity 204 are first fabricated by a process, for example, including but not limited to etching or mechanical milling. For an etching process, the insulation layers 202a and 202b can serve as etching masks for the top side and the bottom side, respectively. After providing the cavity 204 and blind vias 203, the insulation layer 202a may need to be re-attached or extended to cover the side walls of the blind vias 203 through further deposition, diffusion, or printing.

Figure 3B:
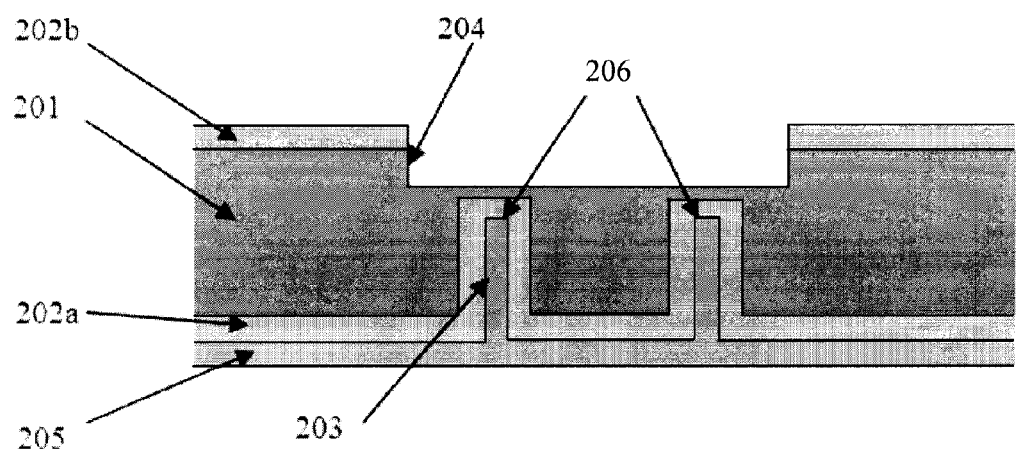

As shown in FIG. 3(b), metal is filled into the blind vias 203 to form metal pillars 206. The filling can be done with an electroplating process. A metal layer 205 covering the backside of the substrate 201 can be provided simultaneously with the metal pillars 206 or later on in the process (e.g., after deepening the cavity 204 as described below with respect to FIG. 3(c)). The metal layer 205 and the metal pillars 206 may further be provided, for example, by sputtering or evaporation.

Figure 3C:
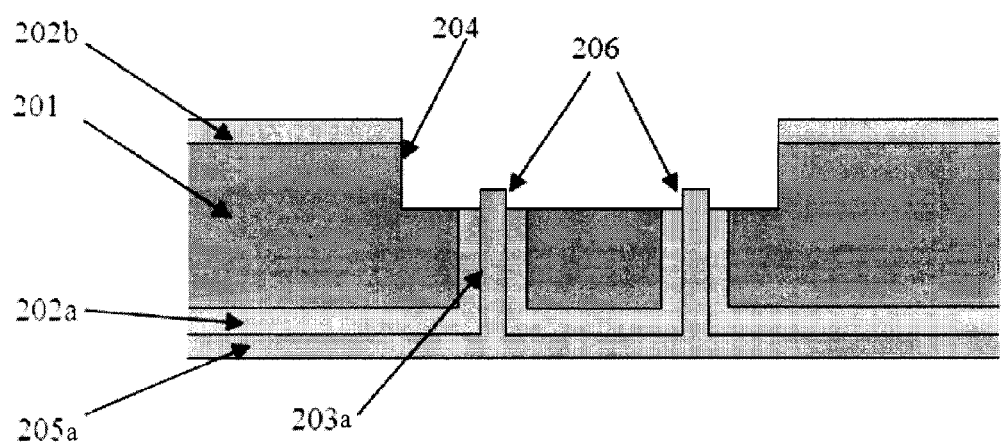

As shown in FIG. 3(c), the cavity 204 on the front-side is deepened by a process—for example, including but not limited to, etching or mechanical milling—until the tips of the metal pillars 206 are exposed. With the tips of the metal pillars 206 are exposed, the blind vias 203 are now referred to as through vias 203a, which connect the top side of the submount with the bottom side of the submount.

Figure 3D:
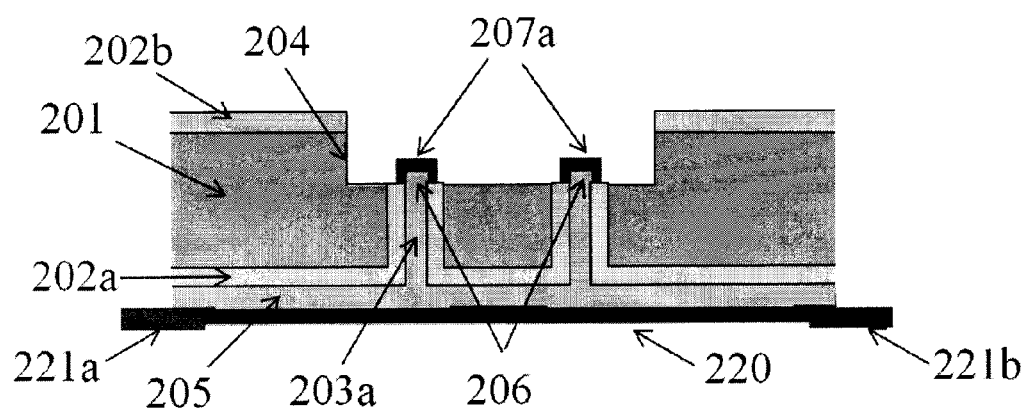

As shown in FIG. 3(d), solder 207a is plated on the tips of the metal pillars 206. The process can be done by electroplating. In one example, this electroplating is performed by connecting the metal layer of a wafer to a cathode (depicted as electrodes 221a and 221b in FIG. 3(d)) and connecting a solder plate to an anode (not pictured), and immersing both in a plating solution such that when an electric current is applied, solder ions are released from the solder plate and dissolve into the plating solution. These ions are deposited on the exposed metal surface of the metal pillars 206 that are connected to the cathode, resulting in the formation of solder 207a on the tips of the metal pillars 206. The individual metal pillars 206 are connected by a metal layer 205 on the backside, which is covered by an insulation layer 220 to prevent the metal layer 205 from being plated with solder. After the electroplating process is complete and solder 207a is obtained, the insulation layer 220 is removed, and the metal layer 205 should remain attached. In an example, the insulation layer 220 is photoresist that is attached by thermal diffusion or chemical vapor deposition processes and removed by organic solvents. It will be appreciated that the electrodes 221a and 221b shown in FIG. 3(d) do not need to be attached to each individual submount since the metal layers of all submounts of the wafer are electrically connected at this point in the fabrication process. Thus, the electroplating can be performed so long as the electrodes 221a and 221b contact any region of the metal layer of the wafer.

Figure 3E:
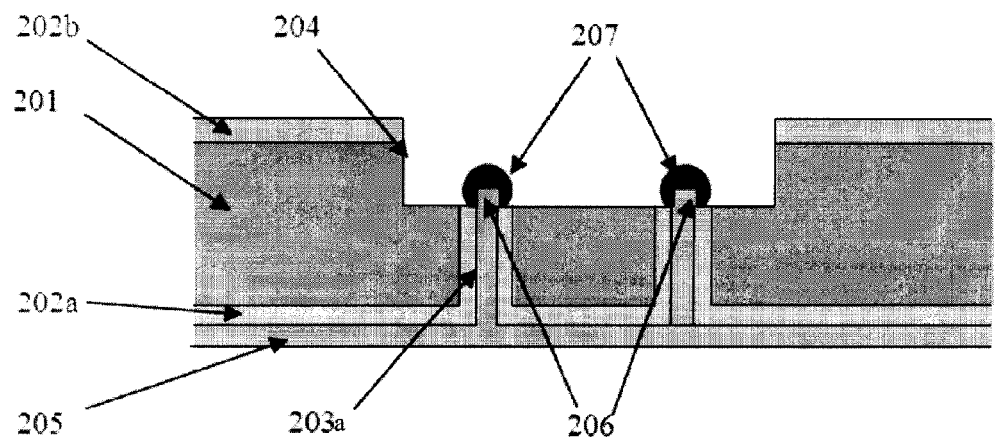

As shown in FIG. 3(e), the whole substrate goes through a reflow process, which results in the solder bumps 207 being formed. In an example, a reflow oven having several heating zones and a conveyor belt is used. A wafer including one or more submounts is put on the conveyor belt and goes through different heating zones of the oven. The wafer is heated up and then cooled down in the oven under a controlled reflow profile. By first melting the solder 207a in the chamber and then cooling it down to solidify again, the process causes the solder 207a to form a spherical shape (solder bumps 207) due to the effect of surface tension.

Figure 3F:
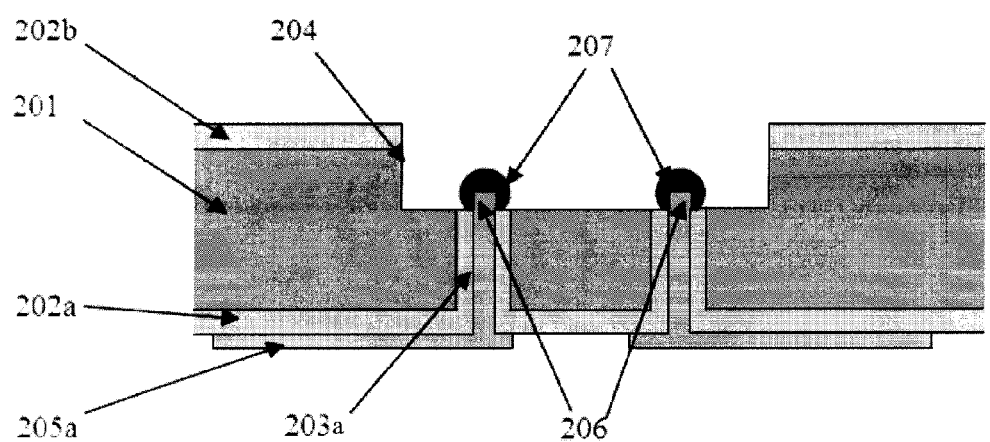

As shown in FIG. 3(f), the metal layer 205 is patterned into a redistribution layer 205a on the backside, connecting the metal pillars 206 in a desired circuit pattern. In one example, the patterning is performed using photolithography. Two or more traces are connected to the anode and cathode of each LED die to pass direct current through the device and light up the LED after the LED has been mounted.

Figure 3G:
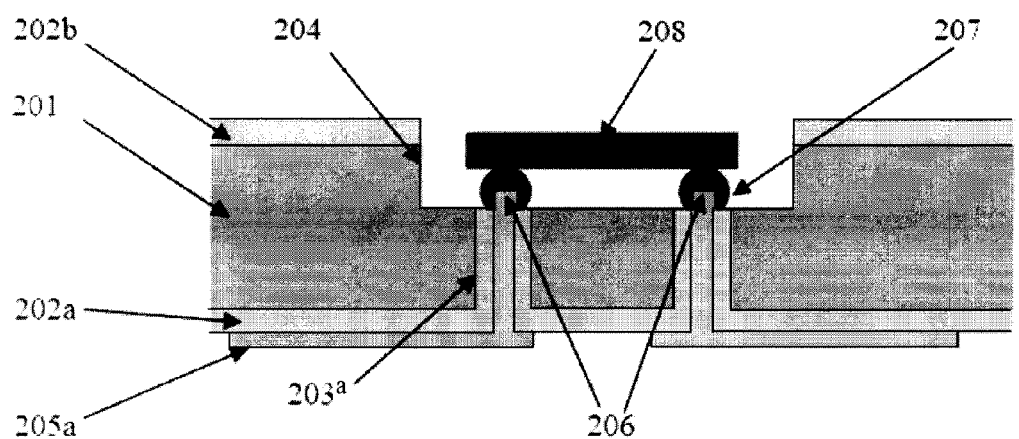

As shown in FIG. 3(g), an LED die 208 is mounted in the cavity 204 on the solder bumps 207. In one example, the mounting is performed with a reflow oven using conventional flip-chip mounting techniques. It will be appreciated that a single cavity 204 can contain more than one LED die, depending on the design. For example, in another embodiment, the cavity 204 contains three LED dies, including red, green, and blue LED dies, all mounted within the same cavity. In yet another embodiment, the cavity contains four LED dies, including one red, one blue, and two green dies. The power supplied to each of the individual LEDs dies is controlled through the circuit connected to the LEDs.

Figure 3H:
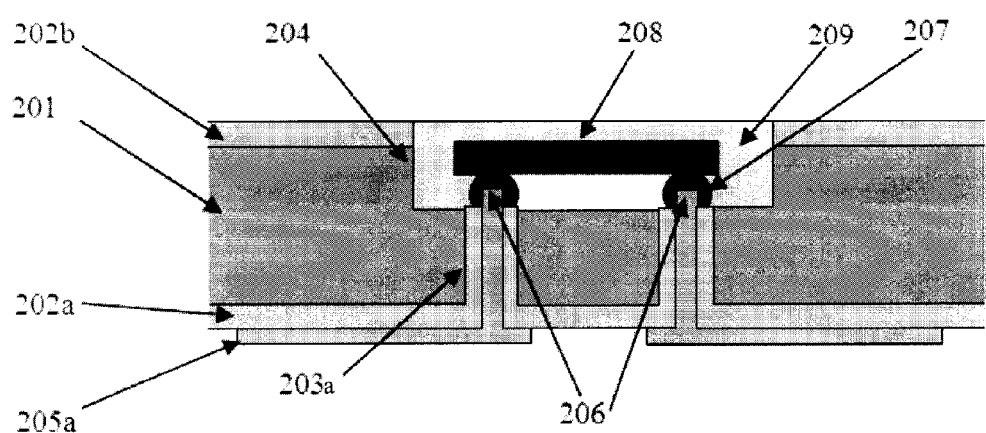

As shown in FIG. 3(h), encapsulant 209 is filled into the cavity 204, for example, by needle dispensing or screen printing. The encapsulant 209 is solidified through curing and serves to protect the LED die 208. The material used for the encapsulant 209 can be, for example, silicone or epoxy, and the encapsulant 209 can be transparent or translucent or be mixed with phosphor powders in order to convert the color of the LED light (e.g., from blue light to white light). In FIG. 3(h), the encapsulant 209 fills the cavity 204 and provides a flat surface level with the front-side of the LED packaging structure. It will be appreciated that in other embodiments, the encapsulant 209 can have other shapes, such as a dome-shape that exceeds the size of the cavity 204.

FIG. 4 depicts a further embodiment of the present invention. The fabrication process of the substrate is similar to the process described above with respect to FIG. 3(a) to FIG. 3(h), and, additionally, a transparent or translucent plate 210 is provided to cover the front-side of the substrate. In an example, the plate 210 is added by wafer bonding. Phosphor layers can then be sprayed onto the plate 210 (as shown below in FIG. 5) so that the phosphor layers do not directly contact the LED (this configuration is often referred to as "remote phosphor"). This configuration helps prevent the phosphor from being heated up so as to improve the performance of the LED.

FIG. 5 shows yet another further embodiment of the present invention. The fabrication process of the substrate is similar to the process described above with respect to FIG. 3(a) to FIG. 3(h) and FIG. 4, and, additionally, encapsulant 209 mixed with phosphor powder is attached to the plate 210 as shown. The cavity 204 can be filled with another type of encapsulant 211 or be left unfilled. In another example, the same type of encapsulant 209 can be used both for attachment to the plate 210 and to fill the cavity 204.

FIG. 6 shows yet another further embodiment of the present invention, where, during the manufacturing process, a reflective layer 230 is attached to the cavity 204 through printing, deposition, or diffusion to increase the reflection of light emitted from the LED dies 208, as shown in FIG. 6. In an example, the layer is produced by sputtering or an evaporation process.

While conventional LEDs are generally packaged on an individual component basis and require molds for lens-forming, it will be appreciated that embodiments of the present invention provide a structure and process that allow for wafer-level packaging (WLP) of LEDs, for example, using a silicon wafer as a substrate. WLP provides the advantages of batch fabrication and component integration, which can be achieved using the "through via" structure for three-dimensional interconnections and high thermal conduction. Additionally, embodiments of the present invention provide a cavity structure for optical reflection and allows for mold-free phosphor printing and encapsulation process.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:
1. A method for fabricating a light-emitting diode (LED) submount, comprising:
  providing a wafer as a substrate;
  providing a cavity in the substrate on a first side of the substrate;
  providing through vias in the substrate, wherein providing the through vias further comprises:
    providing blind vias in the substrate on a second side of the substrate;
    filling the blind vias with metal; and
    etching the substrate within the cavity to expose the metal in the blind vias so as to produce the through vias;
  plating solder onto the exposed metal of the through vias within the cavity;
  providing a redistribution layer on the second side of the substrate, wherein providing the redistribution layer further comprises:
    providing a metal layer on the second side of the substrate; and
    patterning the metal layer so as to produce the redistribution layer; and
  mounting an LED die in the cavity, wherein the LED die is connected to the redistribution layer through the through vias;
  wherein the method further comprises:
    providing a translucent plate attached to the first side of the substrate; and
    providing a layer of encapsulant mixed with phosphor power on the translucent plate.

2. The method of claim 1, wherein the LED die is mounted in the cavity on solder bumps contacting the LED die and the through vias, and the method further comprises: plating metal of the through vias exposed in the cavity with solder; and processing the solder to form the solder bumps.

3. The method of claim 1, further comprising: providing a first insulation layer on the first side of the substrate; providing a second insulation layer, which is located between the redistribution layer and the substrate on the second side of the substrate;

and providing insulation of the substrate from metal of the through vias.

4. The method of claim 1, further comprising: filling the cavity with encapsulant.

5. The method of claim 4, wherein the LED die is a blue LED die and the encapsulant is mixed with phosphor powder so as to cause white light to be emitted when the LED die is turned on.

6. The method of claim 1, further comprising: providing a reflective layer in the cavity.

7. A light-emitting diode (LED) submount, comprising:
a substrate, the substrate comprising a cavity on a first side of the substrate and blind vias filled with metal on a second side of the substrate, wherein the substrate is a wafer, wherein the substrate comprises an etched region within the cavity where the metal in the blind vias is exposed to provide through vias;
solder plated onto the metal within the cavity of the substrate;
a redistribution layer on the second side of the substrate, wherein the redistribution layer comprises a patterned metal layer;
an LED die mounted in the cavity, wherein the LED die is connected to the redistribution layer through the through vias;
a translucent plate attached to the first side of the substrate; and
a layer of encapsulant mixed with phosphor powder disposed on the translucent plate.

\* \* \* \* \*